United States Patent
Kim et al.

(10) Patent No.: US 10,931,298 B2
(45) Date of Patent: Feb. 23, 2021

(54) ANALOG-TO-DIGITAL CONVERTER

(71) Applicants: Samsung Electronics Co., Ltd., Suwon-si (KR); Korea Advanced Institute of Science and Technology, Daejeon (KR)

(72) Inventors: JongPal Kim, Seoul (KR); Seung Tak Ryu, Daejeon (KR); Min Jae Seo, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/535,761

(22) Filed: Aug. 8, 2019

(65) Prior Publication Data

US 2020/0274546 A1 Aug. 27, 2020

(30) Foreign Application Priority Data

Feb. 27, 2019 (KR) .................. 10-2019-0023386

(51) Int. Cl.
  *H03M 1/46* (2006.01)
  *H03M 1/12* (2006.01)

(52) U.S. Cl.
  CPC ......... *H03M 1/466* (2013.01); *H03M 1/1245* (2013.01)

(58) Field of Classification Search
  CPC ..................... H03M 1/466; H03M 1/1245
  USPC ................................. 341/122–165
  See application file for complete search history.

(56) References Cited

U.S. PATENT DOCUMENTS

| 5,281,866 | A |   | 1/1994 | Rundel |                     |
|-----------|---|---|--------|--------|---------------------|
| 5,426,431 | A | * | 6/1995 | Ryu    | ....... H03M 1/466  |
|           |   |   |        |        | 341/158             |
| 5,621,409 | A | * | 4/1997 | Cotter | ....... H03M 1/069  |
|           |   |   |        |        | 341/122             |
| 5,936,564 | A | * | 8/1999 | Jun    | ....... H03M 1/822  |
|           |   |   |        |        | 341/144             |
| 6,897,801 | B2| * | 5/2005 | Confalonieri | .. H03M 1/0682 |
|           |   |   |        |        | 327/337             |

(Continued)

FOREIGN PATENT DOCUMENTS

CN  103684466 B  12/2016
JP    4941056 B2   5/2012

(Continued)

OTHER PUBLICATIONS

Chaedeok Lee and Ohkyong Kwon/Switched Capacitor Circuit and Modulator Using the same/7/26/2019/KR20190088095A (whole document).*

(Continued)

*Primary Examiner* — Lam T Mai
(74) *Attorney, Agent, or Firm* — NSIP Law

(57) ABSTRACT

An analog-to-digital converter includes an input buffer connected to an input terminal receiving an input signal through a first sampling switch, a comparator connected to the input buffer, a sampling capacitor connected between the input buffer and the comparator, and connected to a second sampling switch, a digital-to-analog converter connected to the comparator, and a controller, connected between the comparator and the digital-to-analog converter, configured to output a signal to the digital-to-analog converter based on the comparator.

27 Claims, 12 Drawing Sheets

(56) References Cited

U.S. PATENT DOCUMENTS

| | | | |
|---|---|---|---|
| 7,746,253 B2* | 6/2010 | Kitagawa | H03F 3/45192 |
| | | | 341/122 |
| 8,411,707 B2 | 4/2013 | Molina et al. | |
| 8,686,889 B2 | 4/2014 | Reddy et al. | |
| 9,391,628 B1* | 7/2016 | Lyden | G11C 27/026 |
| 9,742,423 B1* | 8/2017 | Abu Hilal | H03M 1/12 |
| 9,831,889 B1* | 11/2017 | Abu Hilal | H03M 1/466 |
| 10,062,450 B1* | 8/2018 | Moore | H03H 19/004 |
| 2009/0140802 A1* | 6/2009 | Kitagawa | H03F 3/45192 |
| | | | 330/9 |
| 2013/0106444 A1 | 5/2013 | Mueck et al. | |
| 2018/0231997 A1* | 8/2018 | Stanzione | G05F 3/08 |
| 2019/0190526 A1* | 6/2019 | Iguchi | H03M 1/0682 |
| 2019/0280705 A1* | 9/2019 | Bodnar | H03M 1/124 |
| 2019/0280706 A1* | 9/2019 | Bodnar | H03M 1/201 |

FOREIGN PATENT DOCUMENTS

| | | |
|---|---|---|
| KR | 10-1370044 B1 | 3/2014 |
| KR | 10-2019-0118104 A | 10/2019 |
| WO | 2014/060798 A1 | 4/2014 |

OTHER PUBLICATIONS

Kramer, Martin J. et ai. "A 14 b 35 MS/s SAR ADC Achieving 75 dB SNDR and 99 dB SFDR with Loop-Embedded Input Buffer in 40 nm CMOS." *IEEE Journal of Solid-State Circuits*, vol. 50, No. 12, Dec. 2015 (pp. 2891-2900).

* cited by examiner

900

ANALOG-TO-DIGITAL CONVERTER

CROSS-REFERENCE TO RELATED APPLICATIONS

This application claims the benefit under 35 USC § 119(a) of Korean Patent Application No. 10-2019-0023386 filed on Feb. 27, 2019 in the Korean Intellectual Property Office, the entire disclosure of which is incorporated herein by reference for all purposes.

BACKGROUND

1. Field

The following description relates to an analog-to-digital converter (ADC) and method.

2. Description of Related Art

A physical quantity such as a level of current, voltage, or signal used for human communication is an analog value, whereas a digital circuit included in an electronic device operates using a digital value. Thus, an ADC is an essential circuit for communicating between a human and an electronic device, or different electronic devices. In various fields, the ADC is used as a component included in a module configured to perform various functions in a wireless communications system, for example, where the ADC converts a received analog signal to a digital signal.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an analog-to-digital converter includes an input buffer connected to an input terminal receiving an input signal through a first sampling switch, a comparator connected to the input buffer, a sampling capacitor connected between the input buffer and the comparator, and connected to a second sampling switch, a digital-to-analog converter connected to the comparator, and a controller, connected between the comparator and the digital-to-analog converter, configured to output a signal to the digital-to-analog converter based on the comparator.

The comparator may be connected to a common-mode node through the second sampling switch.

The digital-to-analog converter may be connected to a common-mode node through a common-mode switch, and connected to the input buffer through a conversion switch.

The digital-to-analog converter may include capacitors, and capacitor switches configured to control voltages to the capacitors, corresponding to bits, in response to a control signal generated by the controller.

The conversion switch may be configured to disconnect the input buffer from the digital-to-analog converter during a sampling operation, and the common-mode switch may be configured to initialize the digital-to-analog converter by connecting the common-mode node and the digital-to-analog converter during the sampling operation.

The first sampling switch may be configured to connect the input terminal and one end of the input buffer during a sampling operation, and the second sampling switch is configured to connect the common-mode node to a node between the sampling capacitor and the comparator during the sampling operation.

The sampling capacitor may be configured to sample the input signal enabled to one end of the sampling capacitor by the input buffer, based on a common-mode signal enabled to the other end of the sampling capacitor through the second sampling switch, during the sampling operation.

The input buffer may include a bias circuit configured to supply a bias voltage, a capacitor connected between gate nodes of two transistors connected to each other in series, and an internal buffer switch configured to selectively connect the bias circuit and the capacitor.

The internal buffer switch may be configured to charge the capacitor by connecting the bias circuit to the gate nodes, until the input buffer receives a subsequent input signal after the output signal is output.

The first sampling switch may be configured to disconnect the input terminal and the input buffer, until a subsequent sampling operation with respect to a subsequent input signal starts after a sampling operation with respect to the input signal ends, and the second sampling switch may be configured to disconnect the common-mode node from a node between the sampling capacitor and the comparator, until the subsequent sampling operation.

The conversion switch may be configured to connect the digital-to-analog converter and the input buffer, during an input pushing operation after a sampling operation.

The sampling capacitor may be configured to output a target signal, in which the input signal is inverted based on a common-mode signal, to the comparator in response to the common-mode signal received through the conversion switch and the input buffer, during the input pushing operation.

The common-mode switch may be configured to disconnect the digital-to-analog converter and the common-mode node during a conversion operation after an input pushing operation.

The sampling capacitor may be configured to transfer a converted signal received from the digital-to-analog converter to the comparator through the input buffer for each bit, during the conversion operation. The controller may be configured to sequentially determine bit values of a control signal and control the digital-to-analog converter based on the determined bit values, in response to an output of the comparator, which is based on the converted signal, during the conversion operation.

The controller may be configured to output the control signal as the output signal, in response to determination of bit values of, a most significant bit to a least significant bit, the digital-to-analog converter in the control signal.

The comparator may be configured to receive an output of the sampling capacitor and a common-mode signal as an input, when the analog-to-digital converter is configured to operate in a single ended mode.

The comparator may be configured to receive an output of the sampling capacitor and an output of another sampling capacitor as an input, when the analog-to-digital converter is configured to operate in a differential mode.

The digital-to-analog converter may be configured to generate a converted signal in response to a control signal of the controller and transfer the generated converted signal to one end of the input buffer through the conversion switch, during a conversion operation. The input buffer may be configured to transfer the converted signal received by the one end of the input buffer to the sampling capacitor connected to the other end of the input buffer.

In another general aspect, an analog-to-digital converter includes a first signal processor, a second signal processor, a comparator, and a controller. The first signal processor includes a first input buffer configured to receive a first differential signal, a first sampling capacitor connected to the first input buffer, and a first digital-to-analog converter connected to a common-mode node through a first common-mode switch. The second signal processor includes a second input buffer configured to receive a second differential signal, a second sampling capacitor connected to the second input buffer, and a second digital-to-analog converter connected to the common-mode node through a second common-mode switch. The comparator is configured to output a comparison result of comparing a first target signal generated by the first signal processor from the first differential signal and a common-mode signal and a second target signal generated by the second signal processor from the second differential signal and the common-mode signal. The controller is configured to control the first digital-to-analog converter and the second digital-to-analog converter based on the comparison result of the comparator.

In another general aspect, an analog-to-digital conversion method includes initializing a digital-to-analog converter set based on a previous control signal through a common-mode signal enablement, while sampling an input signal to the input buffer, the analog-to-digital converter comprising an input buffer, a sampling capacitor connected to the input buffer, a controller connected to the sampling capacitor through a comparator, and the digital-to-analog converter connected between the input buffer and the controller, generating, by the sampling capacitor, a target signal, in which the input signal is inverted based on a common-mode signal; and sequentially determining and outputting, by the controller, bit values of a control signal with respect to the digital-to-analog converter based on the target signal.

In another general aspect, an analog-to-digital converter includes an input buffer configured to receive a first sampled signal, a comparator, connected to the input buffer, configured to compare a second sampled signal and a common-mode voltage, a digital-to-analog converter connected to the comparator, and a controller, connected between the comparator and the digital-to-analog converter, configured to output a signal based on results of the comparator.

A sampling capacitor may be connected between the input buffer and the comparator, and connected to a second sampling switch.

A first sampling switch may generate the first sampled signal and a second sampling switch generates the second sampled signal.

The second sampling switch may be connected between the common-mode voltage and an input of the comparator.

A conversion switch may connect the input buffer to the digital-to-analog converter.

27. The analog-to-digital converter of claim 26, wherein upon activating the conversion switch, the digital-to-analog converter is configured to transfer a converted signal to an input end of the input buffer.

Other features and aspects will be apparent from the following detailed description, the drawings, and the claims.

Figure 1:
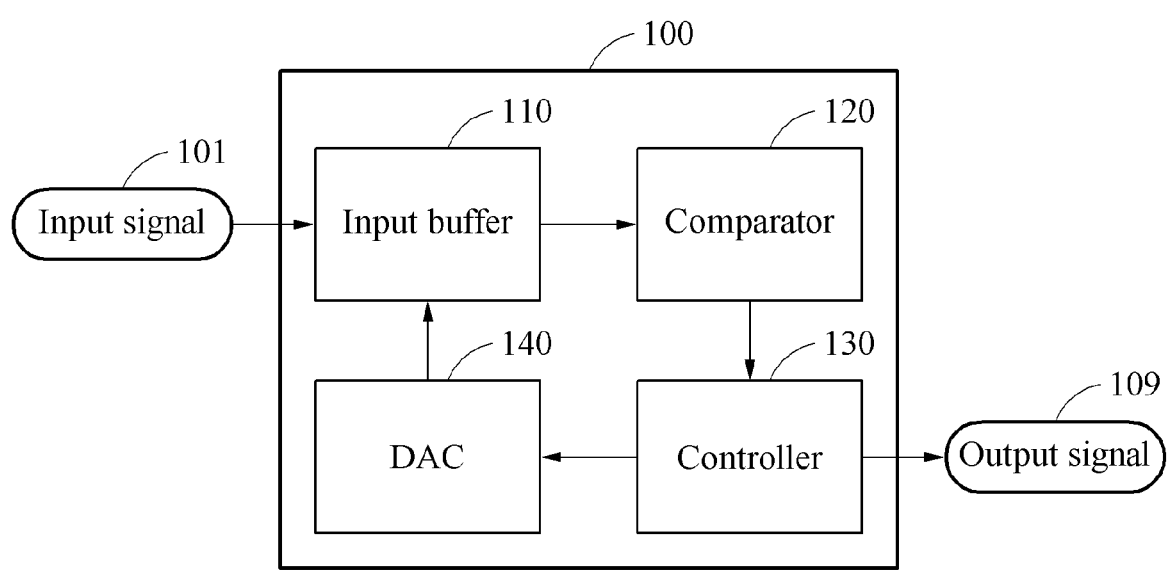
FIG. 1 illustrates an example of a structure of an analog-to-digital converter (ADC).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

A successive approximation register analog-to-digital converter (SAR ADC) configured to generate a digital signal from an analog signal using a successive approximation method may be implemented in a relatively small area and require a relatively low power consumption, and thus, may be suitable for portable electronic devices such as a portable media player (PMP), a mobile phone, and a laptop computer.

A SAR ADC uses a relatively large input capacitance (for example, 3 to 10 pF), in view of a weight matching degree of a capacitive digital-to-analog converter (DAC) and thermal noise, to generate a high-resolution digital output with respect to a provided analog input. To configure such an input capacitance, an input buffer capable of transferring an input signal without loss during a limited sampling time may be desired. Further, the overall performance of a structure in which an input signal is received through an input buffer external of the ADC does not decrease only when the performance of the input buffer (for example, the performance in terms of noise and linearity) is greater than the performance required by the ADC but the external input buffer also has a higher degree of design difficulty, a greater amount of power consumption, and a larger implementation area.

FIG. 1 illustrates an example of a structure of an ADC.

An ADC 100 may include an input buffer 110, a comparator 120, a controller 130, and a DAC 140. The ADC 100 may be a circuit, a hardware element, or a device that converts an input signal 101 having an analog value into an output signal 109 having a digital value.

The input buffer 110 transfers one of the input signal 101 and a converted signal received from the DAC 140 to the comparator 120.

When the input buffer 110 is embedded in the ADC 100, the input buffer 110 transfers the input signal 101 received from an outside environment and the converted signal used for a SAR operation of determining the digital output, and thus, decreasing the performance required for the input buffer 110. Since the same signal distortion occurs when each of the input signal 101 and the converted signal passes through the input buffer 110, the distortion of the input buffer 110 may be ignored when a comparison operation is performed with respect to the input signal 101 or the converted signal at a stage of the comparator 120. Thus, even when the performance (for example, the linearity performance) of the input buffer 110 is lower than the performance of the ADC 100, the ADC 100 outputs the high-resolution digital output signal 109 with respect to the provided input signal 101.

The input buffer 110 operates in a core voltage range, for example, a drain voltage and a source voltage applied to the input buffer 110 may have values within the core voltage range. The core voltage range may be similar to a rail-to-rail range of the input signal 101 input into the input buffer 110. Thus, the input buffer 110 is operable even when a supply voltage within an I/O voltage range that is wider than the core voltage range is not applied resulting in a reduction of the power consumption required for the operation of the input buffer 110. A structure for driving the input buffer 110 in the core voltage range will be described with reference to FIG. 8.

The comparator 120 may generate a comparison result with respect to the signal received from the input buffer 110. For example, when the ADC 100 is configured to operate in a single-ended mode, the comparator 120 may receive an output of a sampling capacitor and a common-mode signal as an input. The comparator 120 may generate a comparison result by comparing the signal received from the input buffer 110 to the common-mode signal. In the single-ended mode, the comparison result may indicate whether a value of the received signal (for example, a signal voltage value) is greater than or less than a value of the common-mode signal (for example, a common-mode voltage value). In another example, when the ADC 100 is implemented to operate in a differential mode, the comparator 120 may generate a comparison result by comparing a first target signal received from a first signal processor including a first input buffer 110 and a first DAC 140 and a second target signal received from a second signal processor including a second input buffer 110 and a second DAC 140. In the differential mode, the comparison result may indicate whether a value of the second target signal is greater than or less than a value of the first target signal, that is, a signal having a greater value of the two target signals. Implementation of the differential mode will be described in detail with reference to FIG. 11. In the example of FIGS. 1 through 10, the operation and structure of the ADC 100 will be described based on the single-ended mode.

The controller 130 may control the DAC 140 based on the comparison result received from the comparator 120. For example, the controller 130 may generate a control signal for determining the value of the converted signal output from the DAC 140 and transmit the control signal to the DAC 140. The control signal may include a control code having an N-bit bit sequence. Here, N is an integer greater than or equal to "1". The controller 130 determines one bit for each successive approximation cycle. The controller 130 may perform a bit determination operation for each of N successive approximation cycles during a conversion operation, thereby obtaining an N-bit digital signal indicating an analog signal. For example, an amplitude range of the input signal 101 (for example, a minimum value and a maximum value of a signal amplitude) may be equally divided into $2^N$ regions, and N-bit digital codes are mapped to analog voltage values of which the amplitude range is divided into $2^N$ regions. The controller 130 finally generates a digital output signal 109 indicating a digital value most similar to the actual analog amplitude of the input signal 101 described above, among the analog voltage values of which the amplitude range is divided into $2^N$ regions. For reference, a circuit operation of sequentially determining bits of the control code in each successive approximation cycle will be described with reference to FIG. 7.

The DAC 140 may output a converted signal based on the control signal received from the controller 130. For example, the control signal may be an N-bit digital signal (for example, a control code), and the DAC 140 may output a converted signal having an analog voltage value indicated by the control signal. The DAC 140 may include a capacitor bank including capacitor pairs respectively corresponding to N bits. The capacitive DAC (C-DAC) 140 including the capacitor bank reduces power consumption, noise, and an area when compared to a current DAC (I-DAC) 140.

For example, the ADC 100 that includes the input buffer 110 and the DAC 140 described above may be used in a biosignal processing device and a mobile device that require low power.

Figure 2:
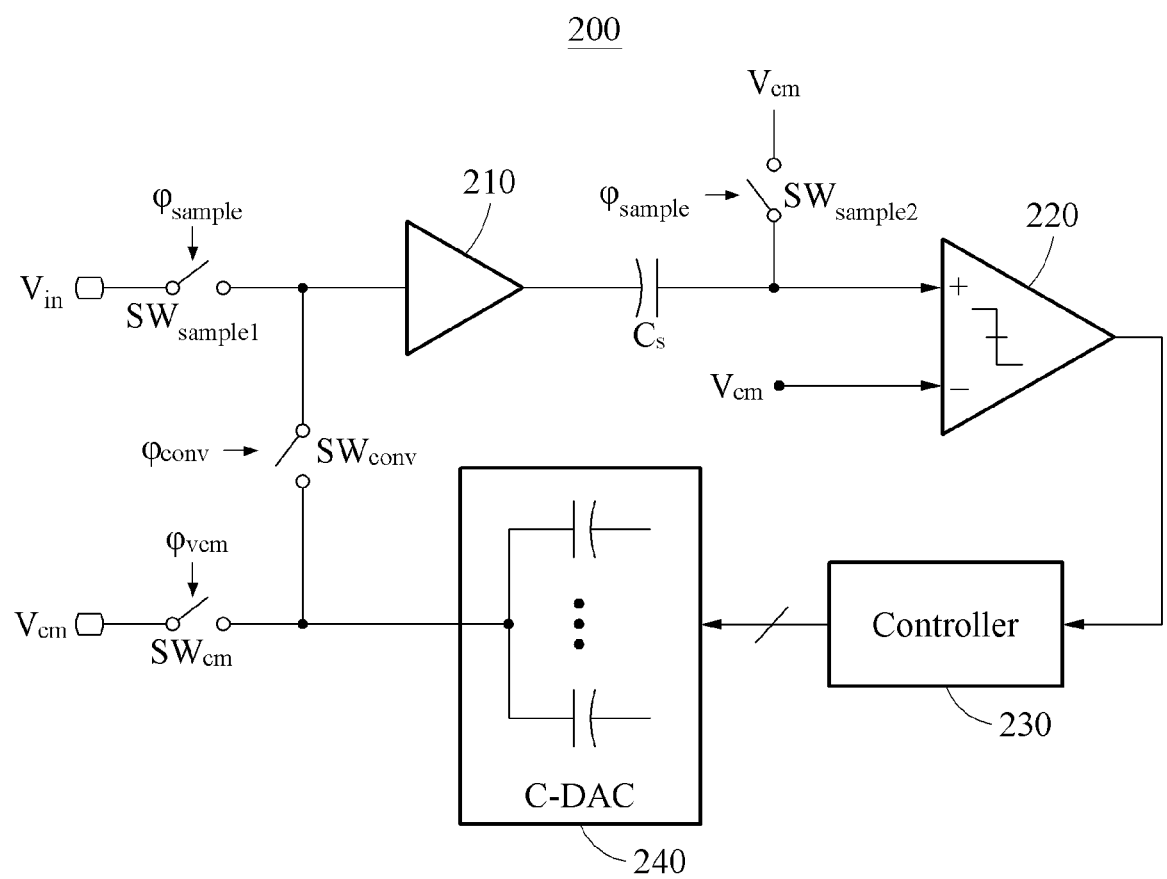
FIG. 2 illustrates an example of a circuit diagram of an ADC.

FIG. 2 illustrates an example of a circuit diagram of an ADC.

An input buffer 210 is connected to an input terminal receiving an input signal $V_{in}$ through a first sampling switch $SW_{sample1}$. One end of the input buffer 210 is connected to the first sampling switch $SW_{sample1}$ and an output end of a DAC 240. The other end of the input buffer 210 is connected to a bottom node of a sampling capacitor. The input buffer 210 may be implemented in a structure operable in the core voltage range as described above.

The sampling capacitor is connected between the input buffer 210 and a comparator 220. For example, the bottom node of the sampling capacitor is connected to the other end of the input buffer 210, and a top node of the sampling capacitor is connected to an input end of the comparator 220.

Figure 11:
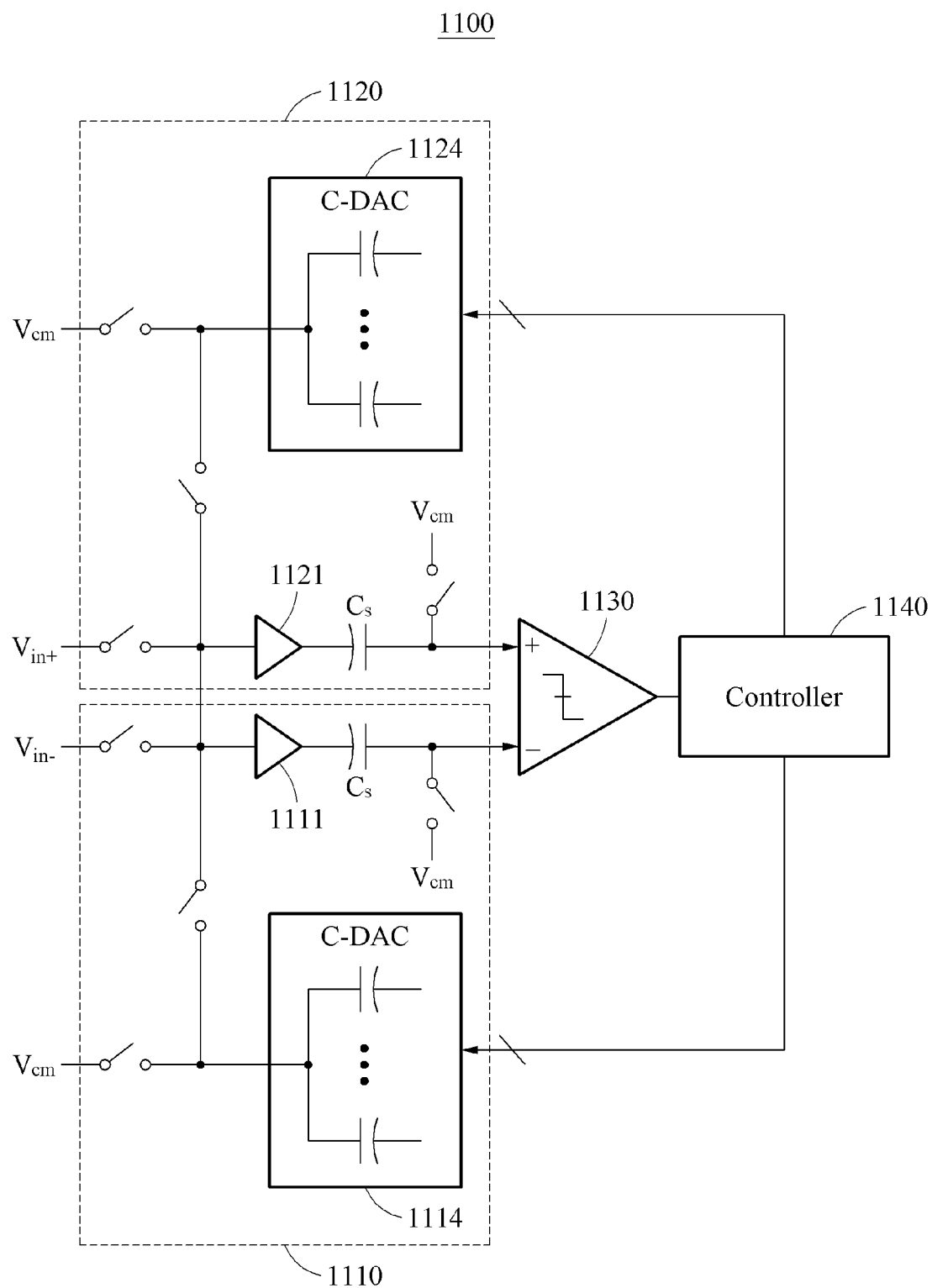
FIG. 11 illustrates an example of a configuration of an ADC.

The comparator 220 is connected to a common-mode terminal through a second sampling switch $SW_{sample2}$, and connected to the sampling capacitor. For example, a (+) input end of the comparator 220 is connected to the top node of the sampling capacitor, and a (−) input end of the comparator 220 is connected to the common-mode terminal. However, the connections of the input ends of the comparator 220 are not limited thereto, and the input ends may be connected reversely depending on another example. Furthermore, FIG. 2 illustrates a configuration in the single-ended mode. A configuration in a differential mode is shown in FIG. 11.

Herein, the common-mode terminal is a terminal to which a common-mode signal having a common-mode voltage $V_{cm}$ is supplied. The common-mode terminal is also referred to as a common-mode node.

A controller 230 may provide an output terminal with an output signal determined while controlling the DAC 240 based on a comparison result of the comparator 220. The output terminal may be a terminal that outputs a final output signal of an ADC 200. The controller 230 may determine an N-bit control code corresponding to the input signal $V_{in}$ by determining a bit for each of N successive approximation cycles with respect to a predetermined input signal $V_{in}$, and outputs the N-bit control code as the final output signal to the output terminal. The controller 230 may control a converted signal output from the DAC 240 by providing the DAC 240 with a control signal during a conversion operation.

The DAC 240 may be connected to the common-mode node through a common-mode switch $SW_{cm}$, and connected to the input buffer 210 through a conversion switch $SW_{conv}$. An input end of the DAC 240 may be connected to the controller 230, and an output end of the DAC 240 may be connected to the conversion switch $SW_{conv}$ and the common-mode switch $SW_{cm}$. When the conversion switch $SW_{conv}$ is activated during the conversion operation, the DAC 240 may transfer the converted signal to the input end of the input buffer 210. Thus, even when the performance (for example, the nonlinearity characteristic) of the input buffer 210 is lower than those of the other elements of the circuit, a high-resolution digital output signal is output. Although FIG. 2 illustrates the DAC 240 being a capacitive DAC, the examples are not limited thereto.

The ADC 200 may be provided in a system requiring high resolution and high linearity. For example, the ADC 200 may be applied to a low-power system that measures bio-signals. Further, the ADC 200 may be implemented in the form of a chip together with another system and provided in a healthcare product. The ADC 200 has a simple structure and thus, is easy to implement. Since the performance required for the input buffer 210 may be relatively low, the ADC 200 may output the high-resolution digital signal using low power, through the structure of the input buffer 210 that will be described below with reference to FIG. 8. The ADC 200 may be used for biosignal processing, image signal sensing, and conversion devices.

The first sampling switch $SW_{sample1}$, the second sampling switch $SW_{sample2}$, the conversion switch $SW_{conv}$, and the common-mode switch $SW_{cm}$ may be activated or inactivated based on switching signals. The respective switching signals for controlling the switches will be described with reference to FIG. 3.

Figure 3:
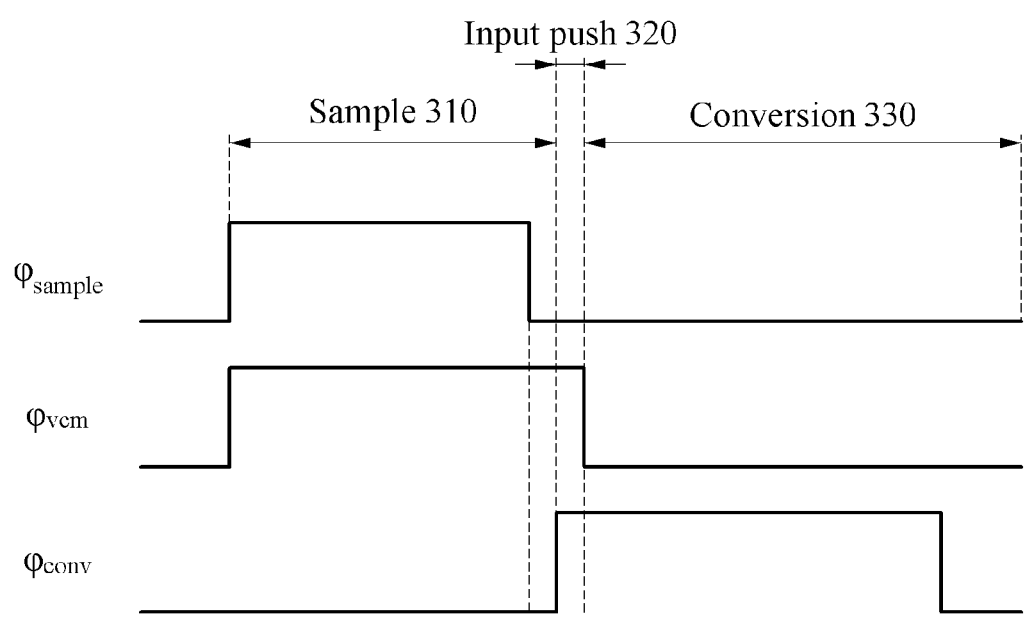
FIG. 3 illustrates an example of a timing diagram of switching signals of an ADC.

FIG. 3 illustrates an example of a timing diagram of switching signals of an ADC.

An operation of an ADC may be divided into a sampling operation 310, an input pushing operation 320, and a conversion operation 330. The sampling operation 310 is an operation of sampling an input signal during a sampling time. The input pushing operation 320 is an operation of changing an output voltage of a sampling capacitor based on a signal received from the input buffer during a common-mode enablement time after sampling. The conversion operation 330 is an operation of approximating the input signal to a digital bit during conversion time.

The first sampling switch $SW_{sample1}$ and the second sampling switch $SW_{sample2}$ are controlled based on a sampling enablement signal $\varphi_{sample}$. For example, during the sampling operation 310, the ADC activates the first sampling switch $SW_{sample1}$ and the second sampling switch $SW_{sample2}$ by enabling the sampling enablement signal $\varphi_{sample}$. In the input pushing operation 320 and the conversion operation 330 after the sampling operation 310, the ADC inactivates the first sampling switch $SW_{sample1}$ and the second sampling switch $SW_{sample2}$ by disabling the sampling enablement signal $\varphi_{sample}$.

For reference, a switch activation is an operation of connecting both ends of a switch, and a switch inactivation is an operation of disconnecting both ends of a switch.

The common-mode switch $SW_{cm}$ is controlled based on a common-mode enablement signal $\varphi_{vcm}$. For example, during the sampling operation 310, the ADC activates the common-mode switch $SW_{cm}$ by enabling the common-mode enablement signal $\varphi_{vcm}$. In the input pushing operation 320 after the sampling operation 310, the ADC also activates the common-mode switch $SW_{cm}$ by maintaining the common-mode enablement signal $\varphi_{vcm}$. In the conversion operation 330 after the input pushing operation 320, the ADC inactivates the common-mode switch $SW_{cm}$ by disabling the common-mode enablement signal $\varphi_{vcm}$.

The conversion switch $SW_{conv}$ is controlled based on a conversion enablement signal $\varphi_{conv}$. For example, during the sampling operation 310, the ADC inactivates the conversion switch $SW_{conv}$ by disabling the conversion enablement signal $\varphi_{conv}$. After that, in the input pushing operation 320 and the conversion operation 330, the ADC activates the conversion switch $SW_{conv}$ by enabling the conversion enablement signal $\varphi_{conv}$.

An operation of the ADC in the sampling operation 310, the input pushing operation 320, and the conversion operation 330 will be described below with reference to FIGS. 4 through 6.

Figure 4:
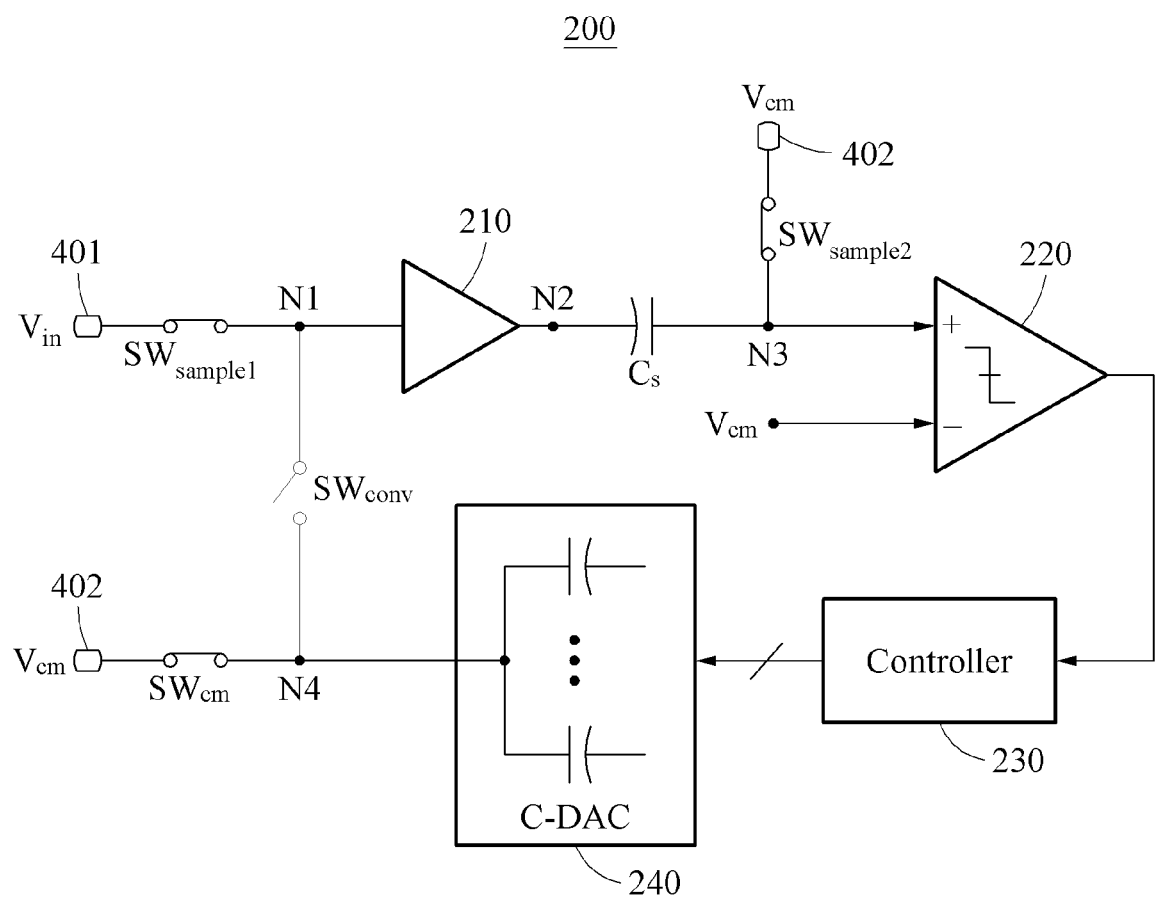
FIGS. 4 through 6 illustrate an example of an operation of an ADC.
Figure 5:
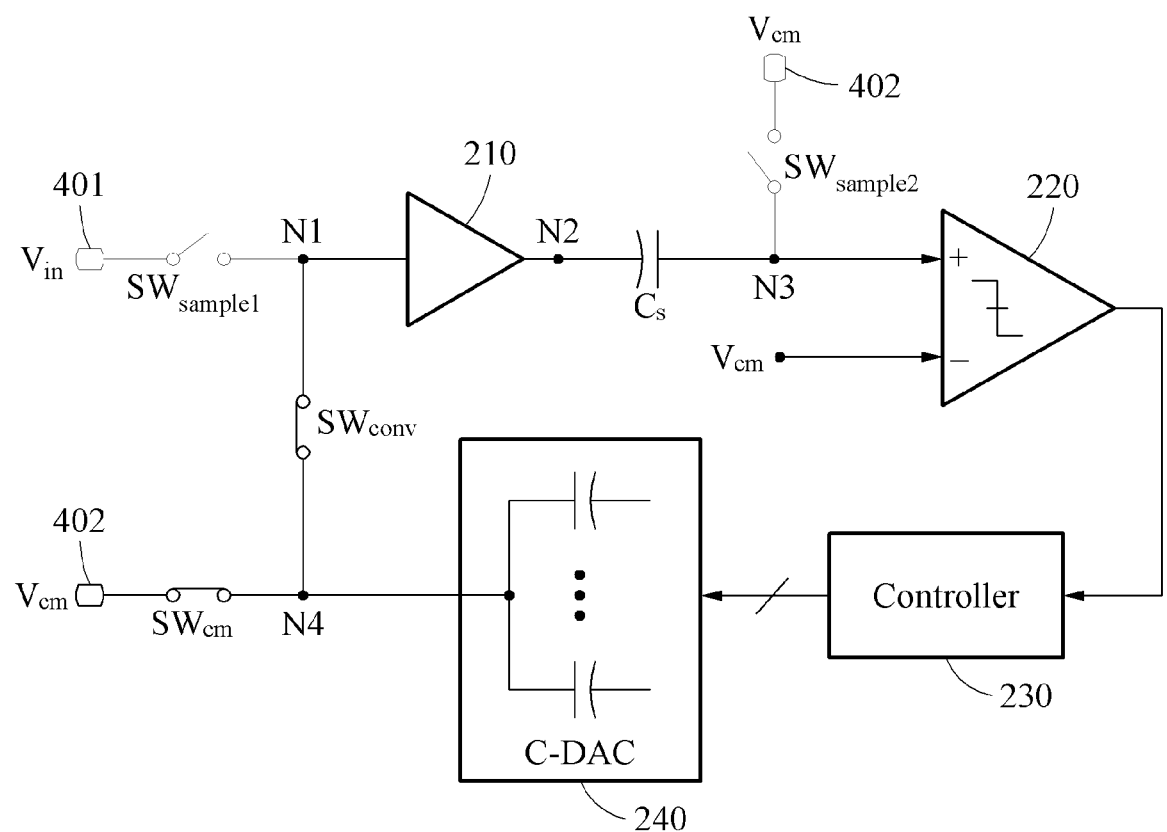
Figure 6:
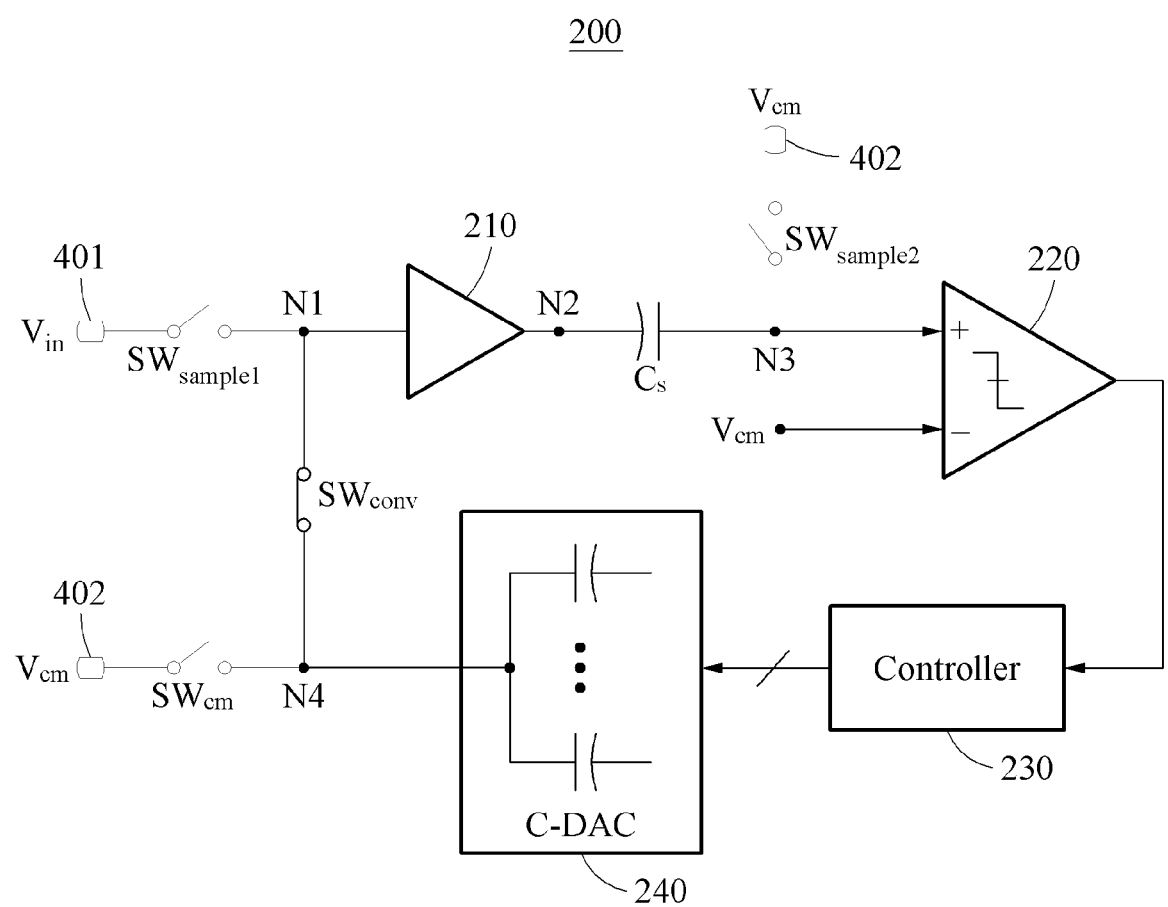

FIGS. 4 through 6 illustrate an example of an operation of an ADC.

Connection states of respective switches in the ADC 200 are determined based on a sequence of operation. For example, when a predetermined input signal is received, the ADC 200 may sequentially perform a sampling operation, an input pushing operation, and a conversion operation. The sampling operation may be an operation of storing the input signal. The input pushing operation may be an operation of inverting an output voltage of a sampling capacitor $C_s$ connected to an output end of the input buffer 210 based on a common-mode voltage by enabling a common-mode signal to an input end of the input buffer 210. Herein, a signal in which the input signal is inverted based on the common-mode voltage is referred to as a target signal. The conversion operation is an operation of determining a digital output signal indicating the input signal using a SAR logic through the comparator 220, the controller 230, and the DAC 240, after the target signal is transferred to the comparator 220. FIG. 4 illustrates connection states of switches in the sampling operation, FIG. 5 illustrates connection states of switches in the input pushing operation, and FIG. 6 illustrates connection states of switches in the conversion operation.

Hereinafter, for ease of description as non-limiting examples, an example in which a supply voltage $V_{dd}$ of a circuit is 1V, a ground voltage is 0V, a common-mode voltage $V_{cm}$ is 0.5V, and a voltage of the input signal $V_{in}$ is 0.75V will be described. A node to which the first sampling switch $SW_{sample1}$, the input buffer 210, and the conversion switch $SW_{conv}$ are connected will be indicated as a node N1. A node to which the input buffer 210 and the sampling capacitor $C_s$ are connected will be indicated as a node N2. A node to which the second sampling switch $SW_{sample2}$, the sampling capacitor $C_s$, and the comparator 220 are connected will be indicated as a node N3. A node to which the conversion switch $SW_{conv}$, the common-mode switch $SW_{cm}$, and the DAC 240 are connected will be indicated as a node N4.

In FIG. 4, the first sampling switch $SW_{sample1}$, the second sampling switch $SW_{sample2}$, and the common-mode switch $SW_{cm}$ are activated, and the conversion switch $SW_{conv}$ is inactivated.

The conversion switch $SW_{conv}$ disconnects the input buffer 210 and the DAC 240 during the sampling operation. Thus, during the sampling operation, a top branch including the input buffer 210 and the sampling capacitor $C_s$ and a bottom branch including the DAC 240 are disconnected.

The common-mode switch $SW_{cm}$ initializes the DAC 240 by connecting a common-mode node 402 and the DAC 240, during the sampling operation. For example, when the DAC 240 is configured as a C-DAC, a voltage set by default is applied to capacitors of a capacitor pair corresponding to each bit in the DAC 240, in the sampling operation. A capacitor bank of the DAC 240 may include N capacitor pairs corresponding to N bits, one end of each of two capacitors included in each capacitor pair are connected through a common node, and the common-mode is connected to the common-mode switch $SW_{cm}$ through the node N4. A capacitor switch supplies a voltage (for example, a voltage $V_{dd}$), e.g., corresponding to a bit value "1" to the other end of one of the two capacitors included in the capacitor pair, and supplies a voltage (for example, a voltage $V_{ss}$), e.g., corresponding to a bit value "0" to the other end of the other capacitor. The common-mode switch $SW_{cm}$ initializes a voltage output from the DAC 240 by supplying the common-mode voltage to the common node of the capacitor bank set by default. Thus, when the voltage applied to the capacitor pair of the DAC 240 changes later in the conversion operation of FIG. 6, the output of the DAC 240 changes based on the common-mode voltage. A detailed structure of the capacitor bank will be described with reference to FIG. 10.

The first sampling switch $SW_{sample1}$ connects an input terminal 401 and one end of the input buffer 210 during the sampling operation. The second sampling switch $SW_{sample2}$ connects the common-mode node 402 to a node between the sampling capacitor $C_s$ and the comparator 220 during the sampling operation.

The sampling capacitor $C_s$ samples the input signal enabled by the input buffer 210 to one end of the sampling capacitor $C_s$, based on the common-mode signal enabled to the other end of the sampling capacitor $C_s$ through the second sampling switch $SW_{sample2}$, during the sampling operation. Thus, the sampling capacitor $C_s$ samples a signal having a voltage difference of $(V_{cm}-V_{in})$.

In this example, when the voltage of the input signal $V_{in}$ is 0.75V, the node N1 has a voltage of 0.75V that is the same as the voltage of the input signal $V_{in}$ since the node N1 is connected to the input terminal 401. When it is assumed a gain of the input buffer 210 is A=1, as an output of the input buffer 210, the node N2 also has a voltage of 0.75V that is the same as the voltage of the input signal $V_{in}$. Since the common-mode signal $V_{cm}$ is enabled to the node N3, the node N3 has a voltage of 0.5V. Since the common-mode signal $V_{cm}$ is also enabled to the node N4, the node N4 has a voltage of 0.5V, noting such values are non-limiting values.

In FIG. 5, the first sampling switch $SW_{sample1}$ and the second sampling switch $SW_{sample2}$ are inactivated, and the common-mode switch $SW_{cm}$ and the conversion switch $SW_{conv}$ are activated.

The first sampling switch $SW_{sample1}$ disconnects the input terminal 401 and the input buffer 210 until a sampling operation with respect to a subsequent input signal starts after the sampling operation with respect to the input signal ends.

The second sampling switch $SW_{sample2}$ disconnects the common-mode node 402 from the node between the sampling capacitor $C_s$ and the comparator 220, until the sampling operation with respect to the subsequent input signal starts after the sampling operation with respect to the input signal ends.

The conversion switch $SW_{conv}$ connects the DAC 240 and the input buffer 210 during an input pushing operation after the sampling operation. Thus, the common-mode signal is transferred from the common-mode node 402 to the input buffer 210. The input buffer 210 transfers the common-mode signal to one end of the sampling capacitor $C_s$.

The sampling capacitor $C_s$ outputs a target signal, in which the input signal is inverted based on the common-mode signal, to the comparator 220 in response to the common-mode signal received through the conversion switch and the input buffer 210, during the input pushing operation.

In this example, the node N1 and the node N4 are connected to each other and thus, have voltages of 0.5V, which is the common-mode voltage. Since a gain of the input buffer 210 is "1" in FIG. 5, the node N2 has a voltage of 0.5V that is the same as the voltage of the node N1, as a voltage value of a signal that is the common-mode signal amplified as much as the gain of the input buffer 210. The voltage of the node N2 changes due to the signal received through the input buffer 210, and the voltage of the node N3 also changes as much as the change in the voltage of the node N2. The voltage of the node N3 in the input pushing operation is expressed by the below Equation 1 for example, $$V_{N3} \text{ @Input pushing} = V_{cm} + \text{delta of } V_{N2} = V_{cm} + (V_{cm} - V_{in}) \quad \text{Equation 1:}$$

In Equation 1, $V_{N2}$ denotes the voltage of the node N2, and $V_{N3}$ denotes the voltage of the node N3. In FIG. 5, it is assumed $V_{cm}$=0.5V and $V_{in}$=0.75V, and thus $V_{N3}$ is 0.25V. The signal appearing at the node N3 is referred to as a target signal, as described above. $V_{N3}$, the voltage of the target signal, has a voltage value, which is the input signal $V_{in}$ inverted based on the common-mode signal $V_{cm}$.

In FIG. 6, the first sampling switch $SW_{sample1}$, the second sampling switch $SW_{sample2}$, and the common-mode switch $SW_{cm}$ are inactivated, and the conversion switch $SW_{conv}$ is activated.

During the conversion operation, the DAC 240 generates a converted signal in response to a control signal of the controller 230, and transfers the generated converted signal to the one end of the input buffer 210 through the conversion switch $SW_{conv}$. In this example, the input buffer 210 transfers the converted signal received at the one end thereof to the sampling capacitor $C_s$ connected to the other end of the input buffer 210.

The common-mode switch $SW_{cm}$ disconnects the DAC 240 and the common-mode node during the conversion operation after the input pushing operation. Here, the conversion operation may include a plurality of successive approximation cycles, and each of the plurality of successive approximation cycles is a cycle for determining a bit value with respect to each bit position of the control signal including N-bits.

For reference, in a successive approximation cycle (for example, a first successive approximation cycle) corresponding to a most significant bit (MSB), the comparator 220 receives the target signal since the DAC 240 is not in operation yet. In the first successive approximation cycle among the plurality of successive approximation cycles, the comparator 220 transfers a comparison result that is based on the target signal to the controller 230. For example, the comparator 220 may output the comparison result indicating whether the target signal is greater than the common-mode signal, by comparing the target signal and the common-mode signal. The controller 230 may determine a bit value corresponding to the MSB in the control signal based on the comparison result that is based on the target signal, and transfers the bit value to the DAC 240. The DAC 240 may output a converted signal corresponding to a control signal in which the bit value of the MSB is determined.

Then, the sampling capacitor $C_s$ transfers the converted signal received from the DAC 240 to the comparator 220 through the input buffer 210 for each bit, during the conversion operation. For example, the voltage of the converted signal may be indicated as $V_{dac}$.

The comparator 220 transfers the comparison result, which is based on the converted signal and received from the sampling capacitor $C_s$ to the controller 230. For example, the comparator 220 may output a comparison result indicating whether the converted signal is greater than the common-mode signal by comparing the converted signal and the common-mode signal.

During the conversion operation, the controller 230 sequentially determines bit values of the control signal in response to the output of the comparator 220 that is based on the converted signal, and controls the DAC 240 based on the determined bit values. For example, the controller 230 may determine the bit values corresponding to the bits based on the comparison result output by the comparator 220 in each successive approximation cycle corresponding to every bit.

The DAC 240 outputs the converted signal based on the control signal received from the controller 230. The DAC 240 outputs the converted signal having an analog voltage value corresponding to a digital code indicated by the control signal.

For example, in a successive approximation cycle corresponding to a j-th bit from the MSB among the N bits (hereinafter, the j-th successive approximation cycle), the DAC 240 receives a control signal in which bit values up to a (j−1)-th bit position from the MSB are determined (hereinafter, the (j−1)-th control signal) from the controller 230. The DAC 240 outputs a converted signal corresponding to the (j−1)-th control signal (hereinafter, the (j−1)-th converted signal). Here, j is an integer greater than or equal to "2" and less than or equal to "N". A voltage value of the (j−1)-th converted signal is indicated as $V_{dac}$. The input buffer 210 transfers the (j−1)-th converted signal to the sampling capacitor $C_s$, and the sampling capacitor $C_s$ outputs a voltage to the node N3 in response to the (j−1)-th converted signal. The output voltage is expressed by the below Equation 2 for example, $$V_{N3} \text{ @Conversion} = V_{cm} + (V_{cm} - V_{in}) + \text{delta of } V_{N2} = + (V_{cm} - V_{in}) + (V_{dac} - V_{cm}) \quad \text{Equation 2:}$$

Thus, in the example of FIG. 6, during the conversion operation, the voltage $V_{dac}$ is represented at the node N1, the node N2, and the node N4, and the voltage $V_{N3}$ represented at the node N3 is $V_{dac} + (V_{cm} - V_{in})$.

The comparator 220 outputs a comparison result with respect to the j-th successive approximation cycle (hereinafter, the j-th comparison result) based on the (j−1)-th converted signal. The j-th comparison result is a signal indicating whether the (j−1)-th converted signal is greater than the common-mode signal. The controller 230 determines the j-th bit value from the MSB based on the j-th comparison result. For example, when the (j−1)-th converted signal is less than the common-mode signal, the controller 230 determines the j-th bit value to be "1". Conversely, when the (j−1)-th converted signal is greater than or equal to the common-mode signal, the controller 230 determines the j-th bit value to be "0".

The controller 230 outputs a control signal as an output signal, in response to determination of bits values of, the MSB to an LSB, the DAC 240 in the control signal. The controller 230 determines the control signal in which all bit values of the N bits are determined, to be the output signal.

Hereinafter, a change in a voltage value of each node occurring depending on the operations of the circuit of FIGS. 4 through 6 will be described with reference to FIG. 7.

Figure 7:
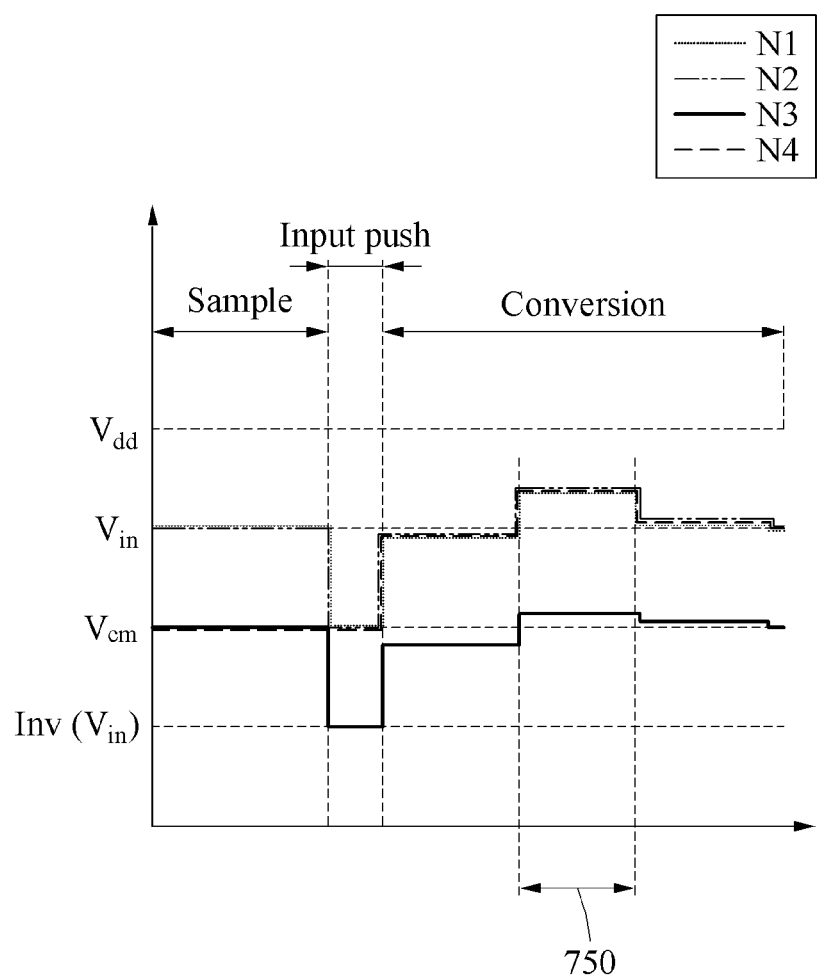
FIG. 7 illustrates an example of signal changes at nodes of an ADC.

FIG. 7 illustrates an example of signal changes at nodes of an ADC.

In a sampling operation, an input buffer using a core voltage transfers an input signal to a sampling capacitor. Thus, voltages of the node N1 and the node N2 are represented as $V_{in}$. Since a common-mode signal is supplied to the node N3 and the node N4, $V_{cm}$ is represented.

In an input pushing operation, the input buffer transfers the common-mode signal to the sampling capacitor, and the sampling capacitor outputs a target signal (for example, $Inv(V_{in})$), in which the input signal is inverted based on the common-mode signal, to the node N3. The other nodes, the node N1, the node N2, and the node N4, represent the common-mode voltage $V_{cm}$.

After that, in a conversion operation, a converted signal $V_{dac}$ generated by a DAC is enabled to a bottom node of the sampling capacitor through the input buffer. For example, a j-th successive approximation cycle 750 among N successive approximation cycles in the conversion operation is a cycle for determining a j-th bit from an MSB. As described above, a comparator generates a j-th comparison result with respect to a (j−1)-th converted signal in the j-th successive approximation cycle 750, and a controller generates a j-th control signal based on the j-th comparison result. Here, the node N1, the node N2, and the node N4 represent a converted voltage value $V_{dac}$ of a (j−1)-th converted signal output from the DAC. The node N3 represents a voltage value according to Equation 2. Each time every successive approximation cycle elapses, the voltage represented at the node N3 is approximated to the common-mode voltage $V_{cm}$, and the voltages represented at the node N1, the node N2, and the node N4 are approximated to the input voltage $V_{in}$, as shown in FIG. 7.

The conversion operation requires a conversion time that is linearly proportional to a resolution (for example, N-bit resolution) of a digital signal.

Figure 8:
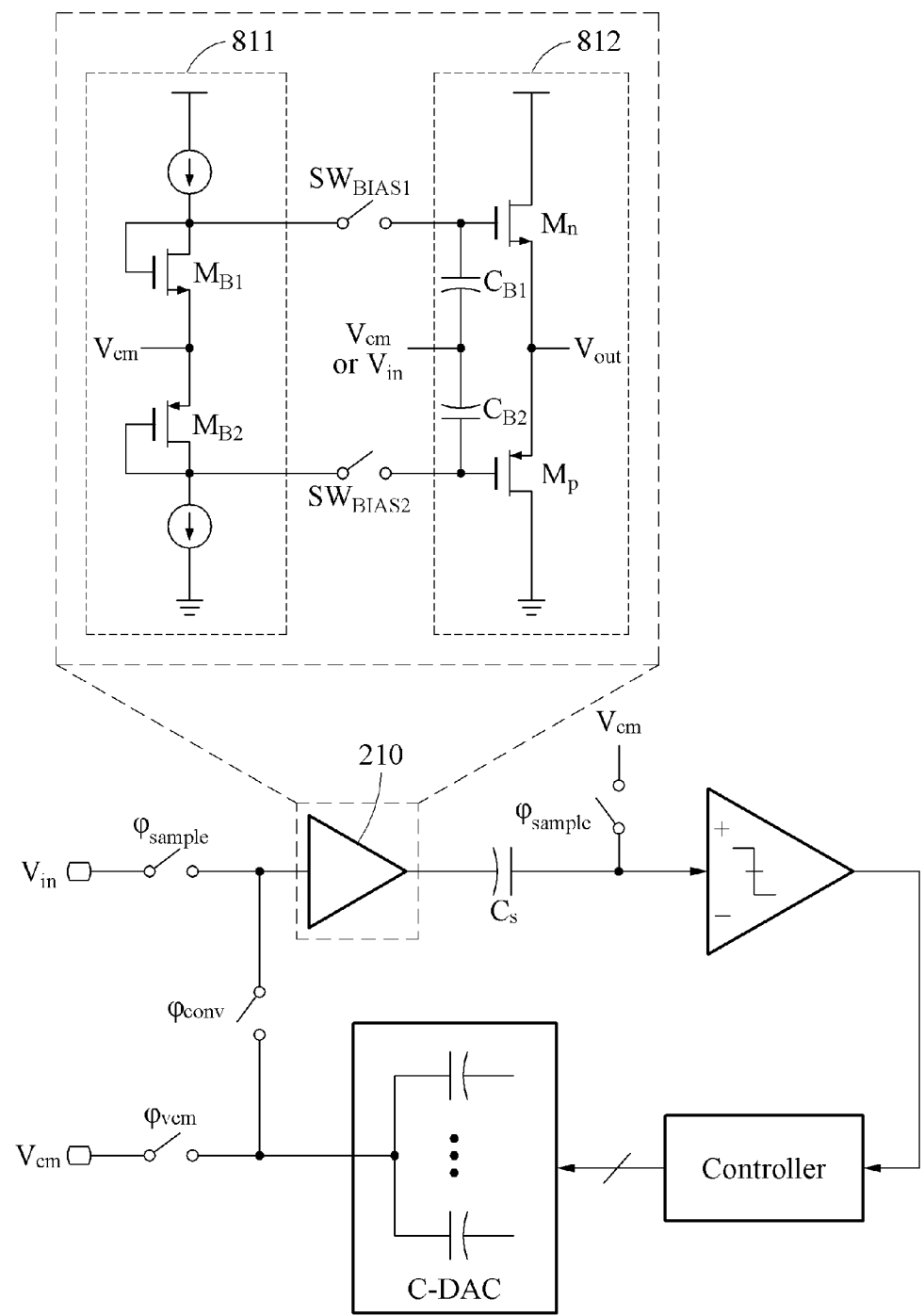
FIG. 8 illustrates an example of a circuit diagram of an input buffer in an ADC.
Figure 9:
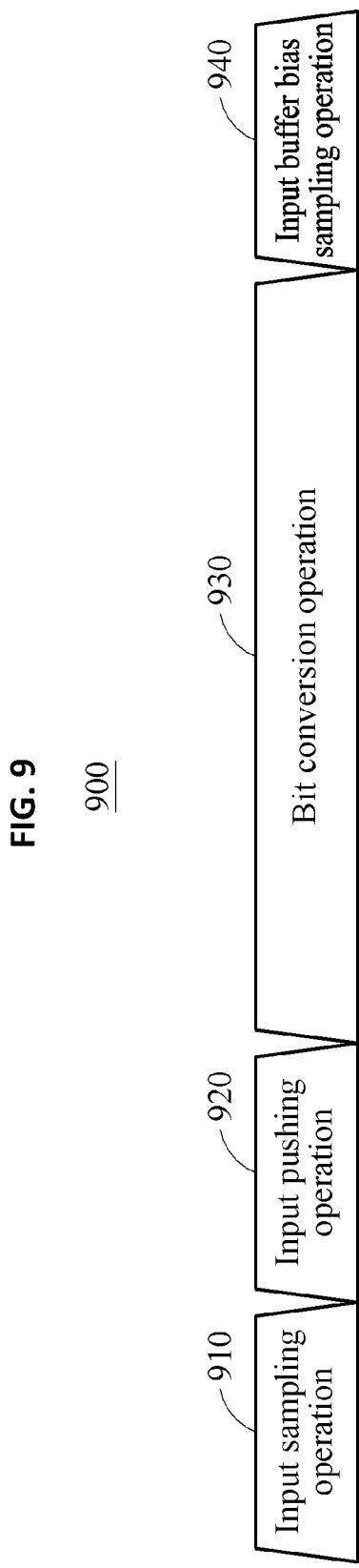
FIG. 9 illustrates an example of a timing of bias sampling for operating an input buffer.

FIG. 8 illustrates an example of a circuit diagram of an input buffer in an ADC. FIG. 9 illustrates an example of a timing of bias sampling for operating an input buffer.

The input buffer 210 may include a bias circuit 811 and a source follower 812.

The bias circuit 811 supplies a bias voltage. For example, the bias circuit 811 may include a first bias transistor $M_{B1}$, a second bias transistor $M_{B2}$, and a current source.

The source follower 812 may include two transistors connected to each other in series. For example, one of the two transistors may be configured as a p-type transistor $M_p$, and the other one may be configured as an n-type transistor $M_n$. The source follower 812 may be implemented as a push-pull source follower.

The input buffer 210 may further include a capacitor connected between gate nodes of the two transistors connected to each other in series. The input signal $V_{in}$ or the common-mode signal $V_{cm}$ transferred to the input buffer 210 may be transferred to the gate nodes of the transistors $M_p$ and $M_n$ through the first capacitor $C_{B1}$ and the second capacitor $C_{B2}$.

An internal buffer switch selectively connects the bias circuit 811 and the capacitor. The internal buffer switch may include a first internal switch $SW_{BIAS1}$ and a second internal switch $SW_{BIAS2}$. For example, the first internal switch $SW_{BIAS1}$ may be connected between the first bias transistor $M_{B1}$ and the n-type transistor $M_n$. The second internal switch $SW_{BIAS2}$ may be connected between the second bias transistor $M_{B2}$ and the p-type transistor $M_p$. The internal buffer switch charges the capacitor by connecting the bias circuit 811 to the gate nodes, until the input buffer 210 receives a subsequent input signal after an output signal is output. The internal buffer switch charges the capacitor with a bias voltage in a period during which the input buffer 210 is not used, and suspends the charging when the input buffer 210 is in use. This may be referred to as DC level shifting with respect to the input signal. For reference, referring to a timing diagram 900 of FIG. 9, the internal buffer switch may be inactivated during an input sampling operation 910, an input pushing operation 920, and a bit conversion operation 930, and may be activated only during an input buffer bias sampling operation 940.

The input buffer 210 operates at a nominal voltage (for example, a voltage within a core range) while transferring the input signal of a rail-to-rail range, through the structure of FIG. 8. Since the two capacitors $C_{B1}$ and $C_{B2}$ are charged with voltages before the input buffer 210 receives the input signal, the source follower 812 maintains voltages between gate nodes and source nodes of the n-type transistor and the p-type transistor. Thus, an operating voltage at which each transistor of the source follower 812 is operable may be achieved irrespective of the amplitude of the input signal, and the input buffer 210 operates normally within the core voltage range other than an I/O voltage range. The input buffer 210 expands an available range of the input signal using DC level shifting through such capacitors.

Figure 10:
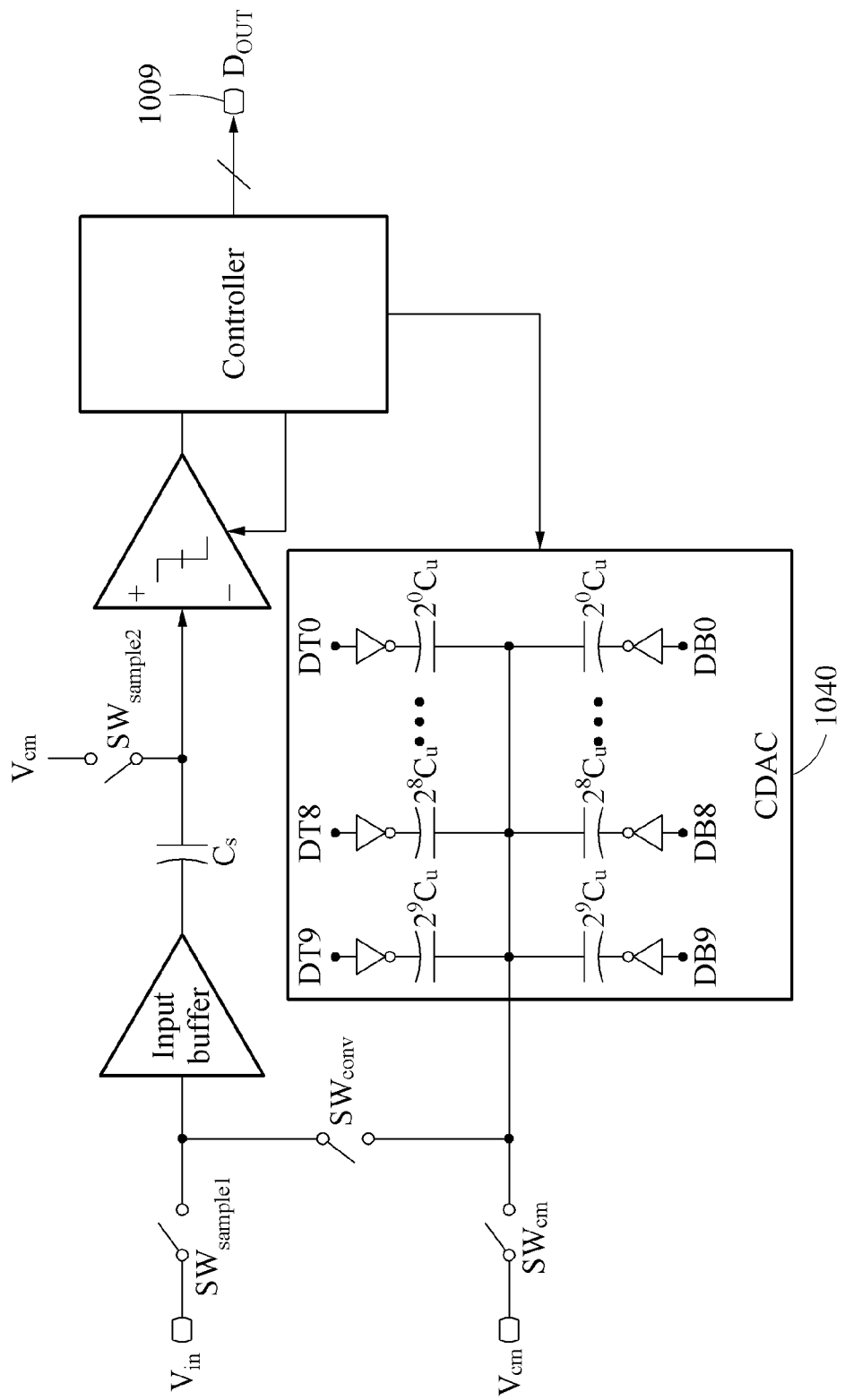
FIG. 10 illustrates an example of a configuration of a digital-to-analog converter (DAC) in an ADC.

FIG. 10 illustrates an example of a configuration of a DAC in an ADC.

A DAC 1040 may include a capacitor bank, and a plurality of capacitor switches.

The capacitor bank may include a plurality of capacitors. For example, when a resolution of the DAC 1040 is N bits, the capacitor bank may include N capacitor pairs. The N capacitor pairs correspond to predetermined bit positions. For example, in FIG. 10, N=10, and a capacitance of a capacitor of a capacitor pair corresponding to an i-th bit position may from an LSB is $2^i C_u$. Here, i denotes an integer of N−1 that is greater than or equal to "0". $C_u$ denotes a basic capacitance value. For example, a capacitor pair corresponding to an MSB in FIG. 10 may have a capacitance of $2^9 C_U$. Top nodes of two capacitors of each capacitor pair are connected to a common node. In a capacitor pair corresponding to a predetermined bit position, a voltage applied to a bottom node of each capacitor changes depending on a bit value with respect to the corresponding bit position. For example, when a bit value with respect to a predetermined bit position is not determined, voltages applied to bottom nodes of capacitors corresponding to the bit position are set by default. In a default state, a source voltage may be applied to the bottom node of one of the capacitors corresponding to the bit position, and a drain voltage may be applied to the bottom node of the other capacitor. DTk and DBk denote digital values indicating voltages applied to a capacitor of a k-th bit from the LSB. Here, k is an integer greater than or equal to "0" and less than or equal to "N−1". Describing based on the MSB, voltages corresponding to DT9=1 and DB9=0 are applied.

The plurality of capacitor switches controls a voltage applied to a capacitor corresponding to each bit, in response to a control signal generated by a controller. For example, a capacitor switch may adjust a voltage applied to the bottom node of each capacitor based on the control signal. For example, when a bit value with respect to the MSB is determined to be "1", voltages corresponding to DT9=1 and DB9=1 may be applied. When the bit value with respect to the MSB is determined to be "0", voltages corresponding to DT9=0 and DB9=0 may be applied.

When bit values with respect to all bit positions of the control signal are determined, the controller outputs the corresponding control signal as an output signal $D_{OUT}$ to an output terminal 1009.

FIG. 11 illustrates an example of a configuration of an ADC.

For example, FIG. 11 is provided to describe an ADC 1100 implemented to operate in a differential mode. The ADC 1100 may include a first signal processor 1110, a second signal processor 1120, a comparator 1130, and a controller 1140.

The first signal processor 1110 may include a first input buffer 1111 configured to receive a first differential signal, a first sampling capacitor connected to the first input buffer 1111, and a first DAC 1114 connected to a common-mode node through a first common-mode switch. The first input buffer 1111, the first sampling capacitor, and the first DAC 1114 in the first signal processor 1110 are connected in the same manner as in the structure described with reference to FIGS. 1 through 9. The first input buffer 1111 of the first signal processor 1110 may be configured to receive the first differential signal, instead of an input signal.

The second signal processor 1120 may include a second input buffer 1121 configured to receive a second differential signal, a second sampling capacitor connected to the second input buffer 1121, and a second DAC 1124 connected to the common-mode node through a second common-mode switch. The second input buffer 1121 of the second signal processor 1120 may be configured to receive the second differential signal, instead of the input signal.

When the ADC 1100 is configured to operate in a differential mode, the comparator 1130 receives an output of the first sampling capacitor and an output of the second sampling capacitor as an input. For example, the comparator 1130 may output a comparison result of comparing a first target signal generated by the first signal processor 1110 from the first differential signal and a common-mode signal, and a second target signal generated by the second signal processor 1120 from the second differential signal and the common-mode signal.

The controller 1140 provides an output terminal with an output signal determined while controlling the first DAC 1114 and the second DAC 1124 based on the comparison result of the comparator 1130.

Operations of the comparator 1130 and the controller 1140 may be identical or similar to those described with reference to FIGS. 1 through 10.

Figure 12:
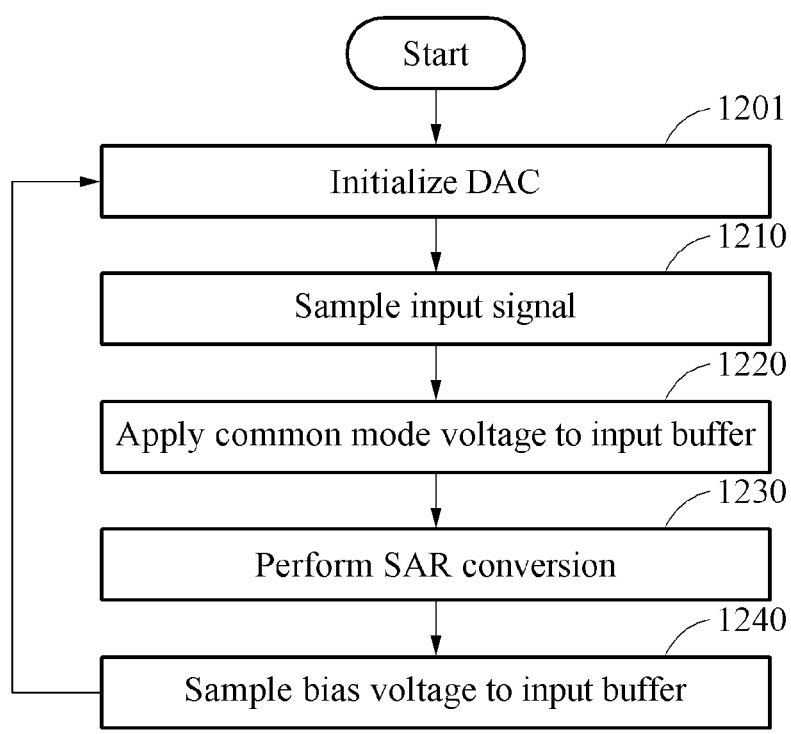
FIG. 12 illustrates an example of an analog-to-digital conversion method.

FIG. 12 illustrates an example of an analog-to-digital conversion method.

In operation 1201, an ADC initializes a DAC. For example, as described in FIG. 4, the ADC may initialize an output voltage of the DAC by providing a common-mode voltage to a common node of the DAC. The ADC may initialize the DAC set based on a previous control signal through a common-mode signal enablement, while sampling an input signal. In one example, to initialize the DAC in step 1201, it is desirable to provide a common mode voltage. As shown in FIG. 10, the DAC is initialized when a common mode voltage is applied to the common node of the DAC due to an upper portion of the DAC receiving a voltage corresponding to DT # and the lower portion of the C-DAC receiving a voltage corresponding to DB #. As is understood, a common mode voltage may be a mean voltage between the voltage corresponding to DT # and the voltage corresponding to DB #.

In operation 1210, the ADC samples the input signal. For example, as described in FIG. 4, the ADC may sample the input signal to a sampling capacitor by transferring the input signal to the sampling capacitor through an input buffer.

In operation 1220, the ADC applies a common-mode voltage to the input buffer. For example, as described in FIG. 5, the ADC may generate a target signal, in which the input signal is inverted based on a common-mode signal.

In operation 1230, the ADC performs a SAR conversion operation. For example, as described in FIG. 6, the ADC may sequentially determine and output bit values of a control signal with respect to the DAC based on the target signal.

In operation 1240, the ADC samples a bias voltage to the input buffer. For example, as described in FIG. 8, the ADC may maintain voltages between source nodes and gate nodes of transistors included in a source follower while buffering the input signal, by charging a capacitor included in the input buffer with the bias voltage.

However, the operation of the ADC is not limited to the description of FIG. 12. The ADC may perform the operations described with reference to FIGS. 1 through 11 concurrently or in parallel.

The ADCs 100, 200, and 1100, and other apparatuses, modules, devices, and other components described herein with respect to FIGS. 1-11 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 12 that performs the operations described in this application is performed by computing hardware, for example, by one or more processors or computers, implemented as described above executing instructions or software to perform the operations described in this application that are performed by the method. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

The instructions or software to control a processor or computer to implement the hardware components and perform the method as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-to-digital converter, comprising:
   an input buffer selectively connected to an input terminal for receiving an input signal using a first sampling switch;
   a comparator;
   a sampling capacitor connected between the input buffer and the comparator, and connected to a second sampling switch;
   a digital-to-analog converter connected to the comparator; and
   a controller, connected between the comparator and the digital-to-analog converter, configured to output a signal to the digital-to-analog converter based on the comparator and a digital signal.

2. The analog-to-digital converter of claim 1, wherein the comparator and the sampling capacitor are connected to a common-mode node through the second sampling switch.

3. The analog-to-digital converter of claim 2, wherein the digital-to-analog converter is connected to a common-mode node through a common-mode switch, and connected to the input buffer through a conversion switch.

4. The analog-to-digital converter of claim 1, wherein the digital-to-analog converter comprises:
   capacitors; and
   capacitor switches configured to control voltages applied to the capacitors respectively corresponding to bits, in response to a control signal generated by the controller.

5. The analog-to-digital converter of claim 3, wherein the conversion switch is configured to disconnect the input buffer from the digital-to-analog converter during a sampling operation, and
   the common-mode switch is configured to initialize the digital-to-analog converter by connecting the common-mode node and the digital-to-analog converter during the sampling operation.

6. The analog-to-digital converter of claim 2, wherein the first sampling switch is configured to connect the input terminal and one end of the input buffer during a sampling operation, and
   the second sampling switch is configured to connect the common-mode node to a node between the sampling capacitor and the comparator during the sampling operation.

7. The analog-to-digital converter of claim 6, wherein the sampling capacitor is configured to sample the input signal enabled to one end of the sampling capacitor by the input buffer, based on a common-mode signal enabled to the other end of the sampling capacitor through the second sampling switch, during the sampling operation.

8. The analog-to-digital converter of claim 1, wherein the input buffer comprises:
   a bias circuit configured to supply a bias voltage;
   a capacitor connected between gate nodes of two transistors connected to each other in series; and
   an internal buffer switch configured to selectively connect the bias circuit and the capacitor.

9. The analog-to-digital converter of claim 8, wherein the internal buffer switch is configured to charge the capacitor by connecting the bias circuit to the gate nodes, until the input buffer receives a subsequent input signal after the output signal is output.

10. The analog-to-digital converter of claim 9, wherein the bias circuit comprises a transistor connected to a current source.

11. The analog-to-digital converter of claim 2, wherein the first sampling switch is configured to disconnect the input terminal and the input buffer, until a subsequent sampling operation with respect to a subsequent input signal starts after a sampling operation with respect to the input signal ends, and
   the second sampling switch is configured to disconnect the common-mode node from a node between the sampling capacitor and the comparator, until the subsequent sampling operation.

12. The analog-to-digital converter of claim 3, wherein the conversion switch is configured to connect the digital-to-analog converter and the input buffer, during an input pushing operation after a sampling operation.

13. The analog-to-digital converter of claim 12, wherein the sampling capacitor is configured to output a target signal, in which the input signal is inverted based on a common-mode signal, to the comparator in response to the common-mode signal received through the conversion switch and the input buffer, during the input pushing operation.

14. The analog-to-digital converter of claim 3, wherein the common-mode switch is configured to disconnect the digital-to-analog converter and the common-mode node during a conversion operation after an input pushing operation.

15. The analog-to-digital converter of claim 14, wherein the sampling capacitor is configured to transfer a converted signal received from the digital-to-analog converter to the comparator through the input buffer for each bit, during the conversion operation, and
   the controller is configured to sequentially determine bit values of a control signal and control the digital-to-analog converter based on the determined bit values, in response to an output of the comparator, which is based on the converted signal, during the conversion operation.

16. The analog-to-digital converter of claim 15, wherein the controller is configured to output the control signal as the output signal, in response to determination of bit values of, a most significant bit to a least significant bit, the digital-to-analog converter in the control signal.

17. The analog-to-digital converter of claim 1, wherein the comparator is configured to receive an output of the sampling capacitor and a common-mode signal as an input, when the analog-to-digital converter is configured to operate in a single ended mode.

18. The analog-to-digital converter of claim 1, wherein the comparator is configured to receive an output of the sampling capacitor and an output of another sampling capacitor as an input, when the analog-to-digital converter is configured to operate in a differential mode.

19. The analog-to-digital converter of claim 3, wherein the digital-to-analog converter is configured to generate a converted signal in response to a control signal of the controller and transfer the generated converted signal to one end of the input buffer through the conversion switch, during a conversion operation, and
   the input buffer is configured to transfer the converted signal received by the one end of the input buffer to the sampling capacitor connected to the other end of the input buffer.

20. An analog-to-digital converter, comprising:
   a first signal processor including a first input buffer configured to receive a first differential signal, a first sampling capacitor connected to the first input buffer, and a first digital-to-analog converter connected to a common-mode node through a first common-mode switch;
   a second signal processor including a second input buffer configured to receive a second differential signal, a second sampling capacitor connected to the second input buffer, and a second digital-to-analog converter connected to the common-mode node through a second common-mode switch;
   a comparator configured to output a comparison result of comparing a first target signal generated by the first signal processor from the first differential signal and a common-mode signal and a second target signal generated by the second signal processor from the second differential signal and the common-mode signal; and
   a controller configured to control the first digital-to-analog converter and the second digital-to-analog converter based on the comparison result of the comparator.

21. An analog-to-digital conversion method, comprising:
   initializing a digital-to-analog converter set based on a previous control signal through a common-mode signal enablement, while sampling an input signal to the input buffer, the analog-to-digital converter comprising an input buffer, a sampling capacitor connected to the input buffer, a controller connected to the sampling capacitor through a comparator, and the digital-to-analog converter connected between the input buffer and the controller;
   generating, by the sampling capacitor, a target signal, in which the input signal is inverted based on a common-mode signal; and
   sequentially determining and outputting, by the controller, bit values of a control signal with respect to the digital-to-analog converter based on the target signal.

22. An analog-to-digital converter, comprising:
   an input buffer configured to receive a first sampled signal;
   a comparator, connected to the input buffer, configured to compare a second sampled signal and a common-mode voltage;
   a digital-to-analog converter connected to the comparator; and
   a controller, connected between the comparator and the digital-to-analog converter, configured to output a signal based on results of the comparator.

23. The analog-to-digital converter of claim 22, further comprising a sampling capacitor connected between the input buffer and the comparator, and connected to a second sampling switch.

24. The analog-to-digital converter of claim 22, further comprising a first sampling switch configured to generate the first sampled signal from an input signal and a second sampling switch configured to generate the second sampled signal from an output of a sampling capacitor connected between the input buffer and the comparator.

25. The analog-to-digital converter of claim 24, wherein the second sampling switch is connected between the common-mode voltage and an input of the comparator.

26. The analog-to-digital converter of claim 22, further comprising a conversion switch configured to connect the input buffer to the digital-to-analog converter.

27. The analog-to-digital converter of claim 26, wherein upon activating the conversion switch, the digital-to-analog converter is configured to transfer a converted signal to an input end of the input buffer.

* * * * *